United States Patent
Ligander

(10) Patent No.: US 8,901,719 B2
(45) Date of Patent: Dec. 2, 2014

(54) TRANSITION FROM A CHIP TO A WAVEGUIDE PORT

(75) Inventor: Per Ligander, Gothenburg (SE)

(73) Assignee: Optis Cellular Technology, LLC, Plano, TX (US)

( * ) Notice: Subject to any disclaimer, the term of this patent is extended or adjusted under 35 U.S.C. 154(b) by 288 days.

(21) Appl. No.: 13/319,171

(22) PCT Filed: May 8, 2009

(86) PCT No.: PCT/EP2009/055606
§ 371 (c)(1),
(2), (4) Date: Nov. 7, 2011

(87) PCT Pub. No.: WO2010/127709
PCT Pub. Date: Nov. 11, 2010

(65) Prior Publication Data
US 2012/0068316 A1    Mar. 22, 2012

(51) Int. Cl.
*H01L 23/48*    (2006.01)
*H01L 23/495*   (2006.01)
*H01P 5/107*    (2006.01)
*H01L 23/66*    (2006.01)
*H01L 23/00*    (2006.01)

(52) U.S. Cl.
CPC .......... *H01L 23/66* (2013.01); *H01L 23/49503* (2013.01); *H01L 2924/1423* (2013.01); *H01L 2224/49171* (2013.01); *H01P 5/107* (2013.01); *H01L 2924/01079* (2013.01); *H01L 2924/14* (2013.01); *H01L 24/49* (2013.01); *H01L 2924/01004* (2013.01); *H01L 2223/6633* (2013.01); *H01L 2224/48247* (2013.01); *H01L 2924/19039* (2013.01); *H01L 2924/30107* (2013.01); *H01L 24/48* (2013.01)
USPC ............... 257/664; 257/E23.088; 257/E23.01

(58) Field of Classification Search
CPC ........... H01L 2224/48247; H01L 2224/49171; H01L 35/00; H01L 35/32; H01L 2924/00; H01L 21/68785; H01L 2223/6633; H01L 23/427; H01L 23/49503; H01L 23/66; H01L 24/48; H01L 24/49; H01L 2924/01004
USPC .............................. 257/E23.01, E23.088, 664
See application file for complete search history.

(56) References Cited

U.S. PATENT DOCUMENTS 5,528,074 A * 6/1996 Goto et al. ..................... 257/664

(Continued)

FOREIGN PATENT DOCUMENTS

EP    0666594 A1    8/1995
EP    0874415 A2    10/1998

(Continued)

OTHER PUBLICATIONS

Office Action issued on Jun. 11, 2013 in corresponding Japanese application No. 2012-508907 with Summary of Grounds for Rejection, 3 pages.

*Primary Examiner* — Stephen W Smoot
*Assistant Examiner* — Edward Chin
(74) *Attorney, Agent, or Firm* — Vincent J. Allen; Carstens & Cahoon, LLP

(57) ABSTRACT

The present invention relates to a transition from a chip to a waveguide port (47, 47', 11), the chip (1, 1', 62) having a first main side (3, 3', 66) and a second main side (4, 4', 67), where the first main side (3, 3', 66) comprises at least one input port (35, 36, 37, 38, 39), arranged to receive an input signal, at least one output port (44, 45; 72), arranged to output an output signal, and at least one electrical functionality. One port (44, 72) of said ports (44, 45; 72; 35, 36, 37, 38, 39) is electrically connected to an electrically conducting probe (48, 48', 73) that is arranged to extend from said one port (44, 72) and at least partly over the waveguide port (47, 47', 77) such that a signal may be transferred between said one port (44, 72) and the waveguide port (47, 47', 77). The present invention also relates to a corresponding package.

13 Claims, 7 Drawing Sheets

Section F-F

(56) References Cited

U.S. PATENT DOCUMENTS

| | | | |
|---|---|---|---|
| 5,912,598 A * | 6/1999 | Stones et al. | 333/26 |
| 5,982,250 A * | 11/1999 | Hung et al. | 333/26 |
| 6,040,739 A * | 3/2000 | Wedeen et al. | 330/66 |
| 6,486,748 B1 * | 11/2002 | Stones et al. | 333/26 |
| 6,707,349 B1 * | 3/2004 | Huang et al. | 333/113 |
| 7,095,292 B2 * | 8/2006 | Sayanagi et al. | 333/26 |
| 7,217,957 B2 * | 5/2007 | Kuhara et al. | 257/98 |
| 7,388,450 B2 * | 6/2008 | Camiade et al. | 333/26 |
| 8,081,044 B2 * | 12/2011 | Ligander | 333/26 |
| 8,126,501 B2 | 2/2012 | Danno et al. | |
| 2006/0214842 A1 * | 9/2006 | Takenoshita et al. | 342/175 |
| 2007/0164420 A1 * | 7/2007 | Chen et al. | 257/691 |
| 2008/0105966 A1 | 5/2008 | Beer et al. | |
| 2009/0159320 A1 * | 6/2009 | Sanjuan et al. | 174/260 |
| 2009/0206473 A1 * | 8/2009 | Lopez et al. | 257/728 |
| 2012/0013499 A1 * | 1/2012 | Hayata | 342/112 |
| 2012/0051000 A1 * | 3/2012 | Laidig et al. | 361/736 |
| 2012/0139099 A1 * | 6/2012 | Lopez et al. | 257/728 |
| 2012/0274410 A1 * | 11/2012 | Koyama | 331/155 |
| 2013/0256850 A1 * | 10/2013 | Danny et al. | 257/664 |

FOREIGN PATENT DOCUMENTS

| | | | |
|---|---|---|---|
| EP | 1367668 | A1 | 12/2003 |
| FR | 2879889 | A1 | 6/2006 |
| JP | 07-221223 | A | 8/1995 |
| JP | 2006-507740 | A | 3/2006 |
| WO | 03/094232 | A1 | 11/2003 |

* cited by examiner

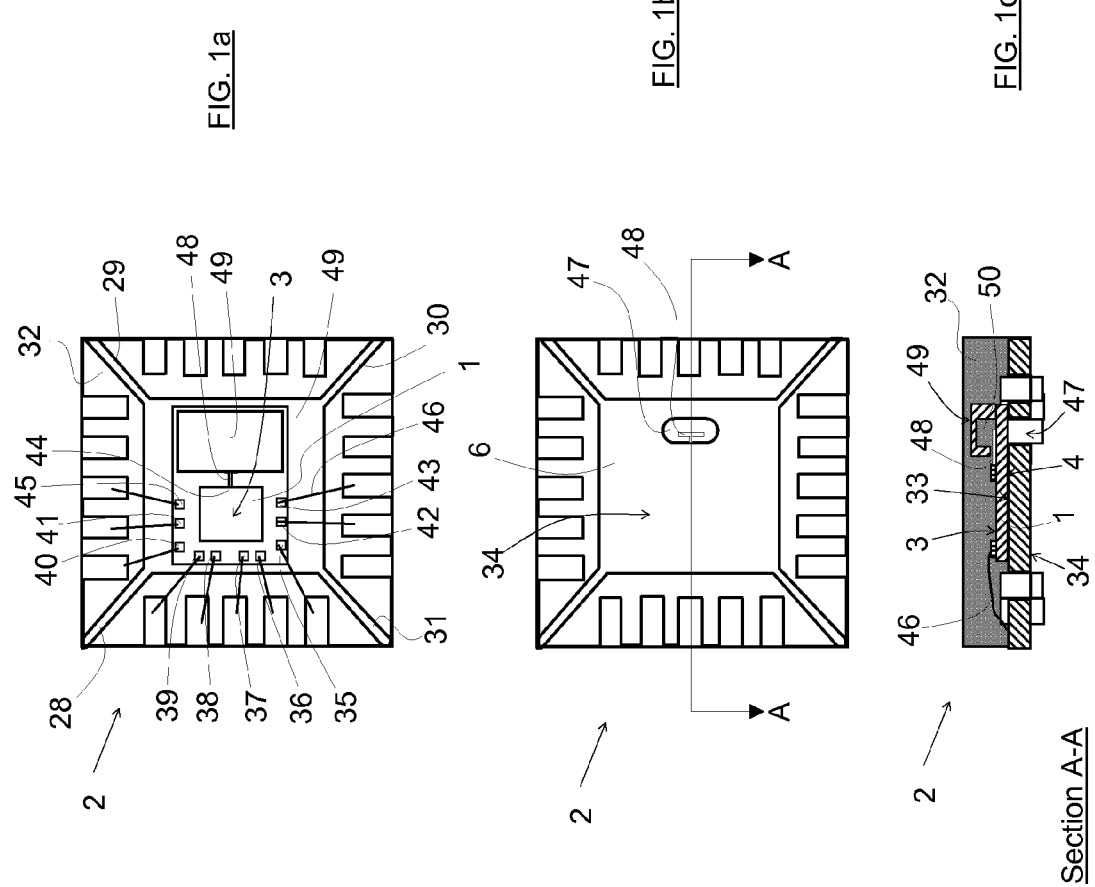

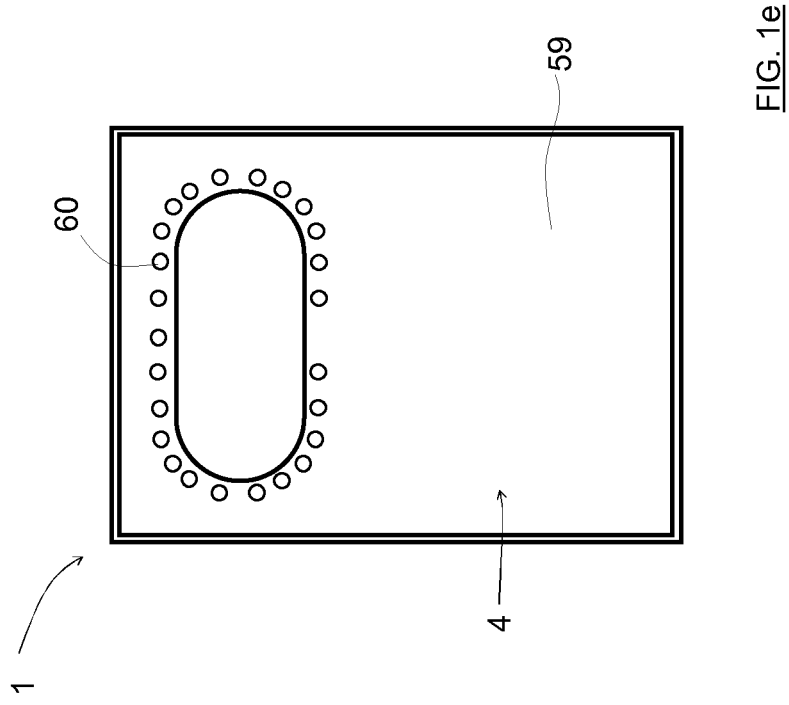
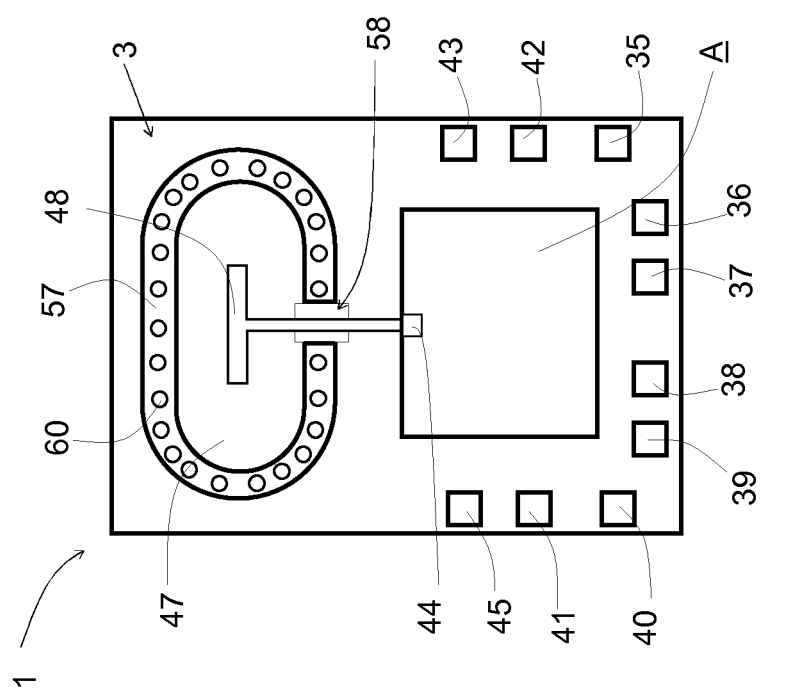

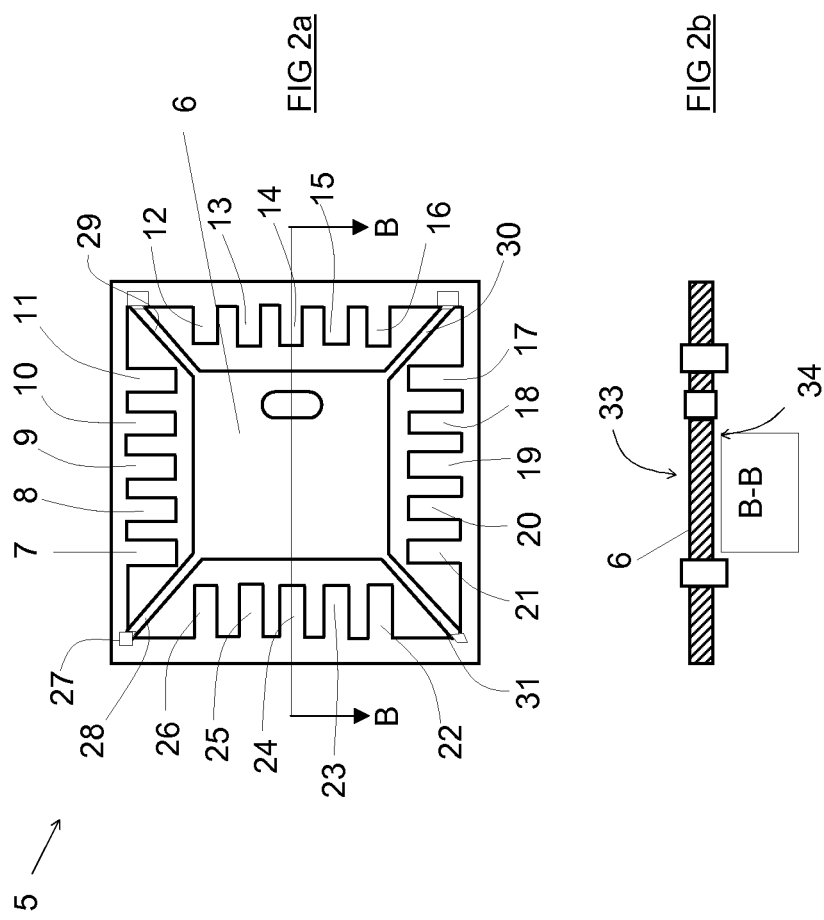

Section C-C

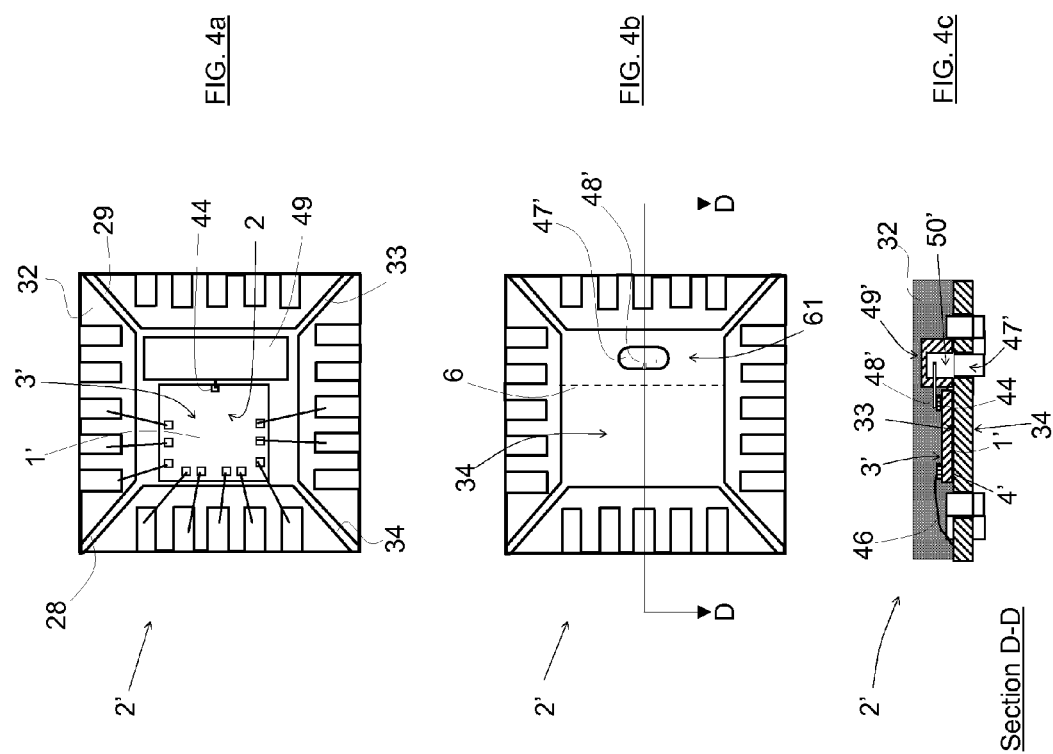

Section E-E

Section F-F

TRANSITION FROM A CHIP TO A WAVEGUIDE PORT

CROSS-REFERENCE TO RELATED APPLICATION

This application is a 35 U.S.C. §371 National Phase Entry Application from PCT/EP2009/055606, filed May 8, 2009, and designating the United States.

TECHNICAL FIELD

The present invention relates to a transition from a first planar structure in the form of a chip to a waveguide port, the first planar structure having a first main side and a second main side, where the first main side comprises at least one input port, arranged to receive an input signal, at least one output port, arranged to output an output signal, and at least one electrical functionality.

The present invention also relates to a package comprising a chip having a plurality of electrical functions, and where bond wires connect chip connections to corresponding package connections comprised in a base structure, where the base structure and the chip at least partly are comprised inside a moulding, forming said package with said package connections accessible,

BACKGROUND

When designing microwave circuits, microstrip transmission lines are commonly used. A microstrip transmission line comprises a metal ground plane and a conductor, where a dielectric carrier material is positioned between the metal ground plane and the conductor. This configuration is economical and relatively easy to design.

However, due to losses in the dielectric carrier material, it is sometimes not possible to use microstrip transmission lines. When there for example is a filter in the layout, the filter may have to be realized in waveguide technology. Waveguides are normally filled with air or other low-loss materials. When there is a filter in a microwave circuit microstrip layout, the filter may thus be realized by means of a waveguide filter in order to lower the losses.

There is also a possibility that a signal that is carried by a microstrip transmission line is intended to be radiated by a radiating element, such as for example an antenna.

There are also a number of other circumstances where a microstrip transmission line is transformed to a waveguide interface, for example when a diplexer or a triplexer is used.

In these cases, the microstrip signal is often first fed through an integrated circuit, normally comprising a so-called chip, before being fed to a waveguide interface. For example, the chip is based on GaAs and comprises an LNA (Low Noise Amplifier), or some other circuitry having a desired electrical functionality. A typical such integrated circuit is mounted in a so-called QFN (Quad Flat No Lead) package which comprises a number of input leads, output leads, ground leads, control leads and bias leads.

There is thus a desire to obtain a transition from such a package to a waveguide interface. The most common way is to solder the package leads to a dielectric carrier material, for example in the form of a PCB (Printed Circuit Board) made from any suitable kind of laminate material, where the package has an output lead that is connected to a probe. The probe is arranged in such a way that it feeds a waveguide and/or an antenna, where the waveguide may be in the form of a surface-mounted waveguide.

Such a surface-mounted waveguide is normally made having three walls and one open side. Metalization is then provided on the side of the dielectric carrier material facing the waveguide, where the metalization serves as the remaining wall of the waveguide, thus closing the waveguide structure when the waveguide is fitted to the dielectric carrier material.

However, when the frequencies used lie around 60-90 GHz, the losses will be too high, resulting in that a satisfactory result is not possible to achieve. The mentioned QFN package, or other similar packages available today, does not present a satisfactory performance in this frequency interval. This is due to the fact that the connections from the chip itself to the package leads normally are wire-bonded with a bond wire. Such a wire-bonding constitutes a large inductance, and induces heavy losses at 60-90 GHz.

There is thus a desire for a transition from a microwave chip to a waveguide interface, where the losses are minimized.

SUMMARY

It is an object of the present invention to provide a transition from a microwave chip to a waveguide interface, where the losses are minimized.

This object is achieved by means of a transition from a first planar structure in the form of chip to a waveguide port, the first planar structure having a first main side and a second main side. The first main side comprises at least one input port, arranged to receive an input signal, at least one output port, arranged to output an output signal, and at least one electrical functionality. One port of said ports is electrically connected to an electrically conducting probe that is arranged to extend from said one port and at least partly over the waveguide port such that a signal may be transferred between said one port and the waveguide port.

According to an embodiment example, the first planar structure is mounted to a first base main side of a base structure, having said first base main side and a second base main side, where the second main side is arranged to face the first base main side. Either the waveguide port is arranged in the base structure, running from the first base main side to the second base main side, or the waveguide port is arranged in the first planar structure and the base structure, running from the first main side to the second base main side.

According to another embodiment example, the first planar structure is a chip having a plurality of electrical functions, and where bond wires connect chip connections to corresponding package connections comprised in the base structure, where the base structure and the chip at least partly are comprised inside a moulding, forming a package with said package connections accessible. The package may be of the type QFN, Quad Flat No Lead.

According to another embodiment example, the first planar structure is mounted to a second planar structure, forming a PCB, printed circuit board, having a first PCB main side (64) and a second PCB main side, and where the waveguide port is arranged in the second planar structure, running from the first PCB main side to the second PCB main side of the second planar structure. It is possible that the conducting probe is formed on a laminate, the laminate having a first laminate side and a second laminate side, where the probe is formed on the second laminate side and where the second laminate side is facing the waveguide port.

According to another embodiment example, an electrically conducting enclosure is positioned over the waveguide port, such that a cavity having electrically conducting walls is formed, enclosing the electrically conducting probe, the dimensions of the cavity being adapted such that the probe may transfer an output signal to the waveguide port in a desired manner.

The object is also achieved by means of a package comprising a chip having a plurality of electrical functions, and where bond wires connect chip connections to corresponding package connections comprised in a base structure, where the base structure and the chip at least partly are comprised inside a moulding, forming said package with said package connections accessible. The package comprises a transition from the chip to a waveguide port, the chip having a first main side and a second main side. The first main side comprises at least one input port, arranged to receive an input signal, at least one output port, arranged to output an output signal, and at least one electrical functionality. One port of said ports is electrically connected to an electrically conducting probe that is arranged to extend from said one port and at least partly over the waveguide port such that a signal may be transferred between said one port and the waveguide port.

According to a package embodiment example, the chip is mounted to a first base main side of a base structure, having said first base main side and a second base main side, where the second main side is arranged to face the first base main side. Either the waveguide port is arranged in the base structure, running from the first base main side to the second base main side, or the waveguide port is arranged in the chip and the base structure, running from the first main side to the second base main side.

The package may be of the type QFN, Quad Flat No Lead.

According to another package embodiment example, an electrically conducting enclosure is positioned over the waveguide port, such that a cavity having electrically conducting walls is formed, enclosing the electrically conducting probe, the dimensions of the cavity being adapted such that the probe may transfer a signal to and/or from the waveguide port in a desired manner.

Other preferred embodiments are disclosed in the dependent claims.

A number of advantages is provided by means of the present invention, for example:
 a robust low loss transition from a microwave chip to a waveguide interface is obtained;
 assembly in a pick&place process is allowed; and
 manufacturing using package standards is allowed.

BRIEF DESCRIPTION OF THE DRAWINGS

The present invention will now be described more in detail with reference to the appended drawings, where:

FIG. 1a shows a top view of a chip in a package according to a first embodiment;

FIG. 1b shows a bottom view of a chip in a package according to the first embodiment;

FIG. 1c shows a sectional view of a chip in a package according to the first embodiment;

FIG. 1d shows a top view of a chip according to the first embodiment;

FIG. 1e shows a bottom view of a chip according to the first embodiment;

FIG. 2a shows a top view of a lead-frame;

FIG. 2b shows a sectional view of a lead-frame;

FIG. 4a shows a top view of a chip in a package according to a second embodiment;

FIG. 4b shows a bottom view of a chip in a package according to a second embodiment;

FIG. 4c shows a sectional view of a chip in a package according to a second embodiment;

DETAILED DESCRIPTION

Figure 3A:
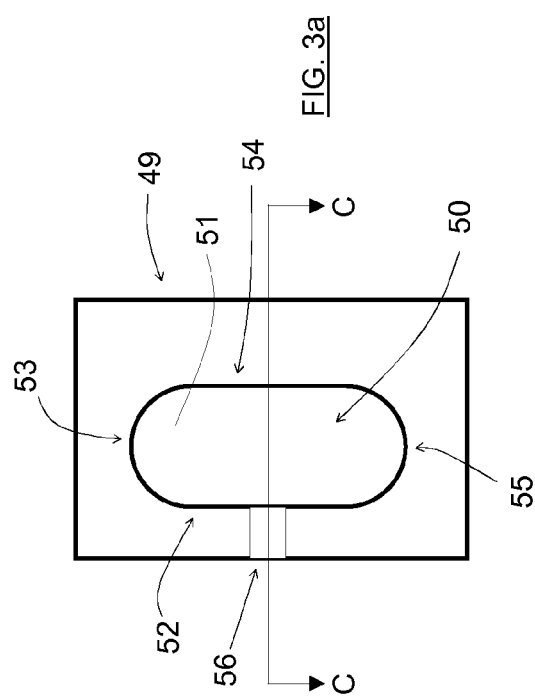
FIG. 3a shows a bottom view of an enclosure according to the first embodiment.

FIG. 1a shows a top view of a chip 1 in a so-called package 2, FIG. 1b shows a corresponding bottom view, and FIG. 1c shows a corresponding side view. The chip 1 comprises a first main side 3 and a second main side 4, where the second main side 4 is attached to a chip pad 6 of a so-called lead-frame.

With reference also to FIG. 2a and FIG. 2b, showing a top view and a sectional view, respectively, of a lead-frame 5, the lead-frame 5 is made in an electrically conducting material and here being in its initial form. The lead-frame 5 constitutes a base comprising a chip pad 6 on which the chip 1 is placed in the package 2, the lead-frame 5 further comprising package connections 7, 8, 9, 10, 11, 12, 13, 14, 15, 16, 17, 18, 19, 20, 21, 22, 23, 24, 25, 26.

When manufacturing a package 2 of this type, the lead-frame 5 is initially provided with an outer frame 27 that connects all the package connections 7, 8, 9, 10, 11, 12, 13, 14, 15, 16, 17, 18, 19, 20, 21, 22, 23, 24, 25, 26 (the reference numbers of the package connections are not being indicated in FIGS. 1a and 1b for the sake of clarity of these Figures). The outer frame 27 is connected to the chip pad 6 by means of holding leads 28, 29, 30, 31, in this way all the parts of the lead-frame 5 are held together. The chip and the lead-frame are covered in a plastic mould 32, shown transparent for the sake of clarity in FIG. 1c, such that the package connections in the lead-frame are accessible.

When the chip 1 and the lead-frame 5 have been covered in a plastic mould 32, the outer frame 27 is removed, for example by means of milling, such that the package connections 7, 8, 9, 10, 11, 12, 13, 14, 15, 16, 17, 18, 19, 20, 21, 22, 23, 24, 25, 26 are electrically separated from each other in the final package, as shown in the FIGS. 1a and 1b. The holding leads 28, 29, 30, 31 remain in the package 2, unconnected, constituting residual parts that no longer have any function.

Generally, the lead-frame 5 constitutes a base structure, having a first base main side 33 and a second base main side 34, where the second main side 4 of the chip 1 faces the first base main side 33 when it is attached to the chip pad 6.

With reference to the FIGS. 1a-1e, where FIG. 1d shows a top view of the chip 1 and FIG. 1e shows a bottom view of the chip 1, the first main side 3 comprises a number of metalized pads. These pads are connected to the circuitry of the chip 1 which for example comprises an LNA (Low Noise Amplifier) which generally constitutes an electrical functionality. In this example, a first pad 35, second pad 36, third pad 37, fourth pad 38 and fifth pad 39 function as inputs for input signals, a sixth pad 40 functions as input for bias voltage, a seventh pad 41 functions a ground, an eighth pad 42 and a ninth pad 43 function as input for control signals and a tenth pad 44 and an eleventh pad 45 function as outputs for output signals. The pads 35, 36, 37, 38, 39, 40, 41, 42, 43, 45 are connected to corresponding package connections 22, 23, 24, 25, 26, 7, 8, 20, 19, 9 by means of bond wires 46 (only one bond wire is indicated in FIG. 1a for the sake of clarity of the Figure) with the exception of the tenth pad 44, as will be discussed below. Some package connections 10, 11, 12, 13, 14, 15, 16, 17, 18, 21 are not utilized and remain unconnected. The pads 35, 36, 37, 38, 39, 40, 41, 42, 43, 44, 45 generally constitute chip connections.

Of the output signals, one is intended to be fed into a waveguide port.

According to the present invention, a waveguide port 47 is arranged in the chip 1 and in the lead-frame's chip pad 6, the waveguide port 47 being arranged in the chip 1 in the form of a passage and in the form of an opening in the chip pad 6, the waveguide port 47 running from the first main 3 side to the second base main side 34.

The output signal that is intended to be fed into the waveguide port is fed to the tenth pad 44 which in turn is connected to an electrically conducting probe 48. The probe 48 is arranged to extend from the pad 44 and partly over the waveguide port 48. In this way, an output signal may be transferred from the tenth pad 44 to the waveguide port 47.

Figure 3B:
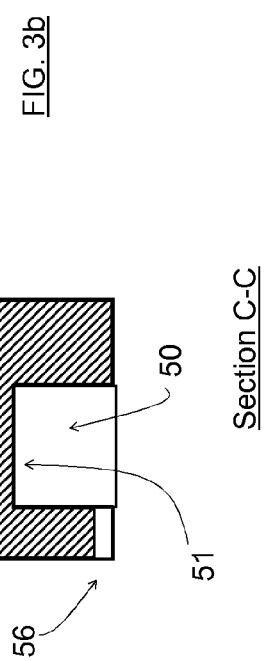
FIG. 3b shows a sectional view of an enclosure according to the first embodiment.

In order to obtain a matched transition to the waveguide port 47, an electrically conducting enclosure 49 is positioned over the waveguide port as shown in FIG. 1a and FIG. 1c, such that a cavity 50 having electrically conducting walls is formed enclosing the electrically conducting probe 48. The enclosure 49 is shown more in detail in FIG. 3a, showing a bottom view and FIG. 3b, showing a sectional view.

The dimensions of the cavity 50 are adapted such that the probe 48 may transfer an output signal to the waveguide port 47 in a desired manner, i.e. normally the dimensions of the cavity 50 are adapted such that a matched transition to the waveguide port 47 is obtained.

The enclosure 49 comprises a first wall 51, which has a main extension plane that essentially is parallel to the main sides 3, 4 of the chip, and a second wall 52, third wall 53, fourth wall 54 and fifth wall 55. The latter walls 52, 53, 54, 55 have main extension planes that are essentially perpendicular to the main extension plan of the first wall 51, extending towards the first main side 3 and the waveguide port 47 such that the cavity 50 is defined by said walls 51, 52, 53, 54, 55. The enclosure 49 is mounted to the first main side 3 of the chip 1, such that the second wall 52, third wall 53, fourth wall 54 and fifth wall 55 contact the first main side 3.

The second wall 52 comprises a probe transition 56 where the second wall 52 reaches the first main side 3 when mounted, allowing the probe 48 to pass into the cavity 50 without being in electrical contact with the enclosure. The transition 56 normally is in the form of a small opening at the bottom of the second wall.

The tenth pad 44 does not have to be a pad to which a probe 48 is fastened, instead the probe 48 and the tenth pad may be formed from the same part where the tenth pad extends in such a way that transits into a probe. In this way, no separate probe part will have to be manufactured and attached to the chip 1. Irrespective of if the tenth pad 44 and the probe 48 are different parts or are formed from the same part, they are electrically connected to each other.

As shown in FIG. 1d and FIG. 1e, on the first main side there is a metalization forming a frame 57 around the waveguide port 47 in the chip 1, except for a probe transition 58. The second main side 4 is covered by a metalization 59, except for the waveguide passage in the chip 1. The frame 57 comprises a number of via holes, for reasons of clarity only one is shown with a reference number 60, but of course all the vias shown are of the same kind. The vias 60 are electrically connecting the frame 57 to the metalization 59 such that a virtual electrically conducting wall is obtained along the height of the chip in the waveguide passage in the chip 1. There is thus no opening in the chip 1 itself; there is only a passage through the chip material that is defined by means of the frame 57 and the vias 60. There is, however, an opening in the chip pad 6 to which the chip 1 is mounted.

A second embodiment will now be described with reference to FIG. 4a, FIG. 4b and FIG. 4c, where these Figures correspond to FIG. 1a, FIG. 1b and FIG. 1c, and the same reference number are used for the parts which remain from the first embodiment. Here, the chip 1' does not cover a certain area 61 of the chip pad 6, where the waveguide port 47' is arranged in the chip pad 6 only. The enclosure 49' is not mounted to the chip 1', but to the first base main side 33 of the lead-frame 5, at the area 61 which is not covered by the chip 1'. The lead-frame is here of the same type as the one described previously with reference to FIG. 2a and FIG. 2b.

Figure 5A:
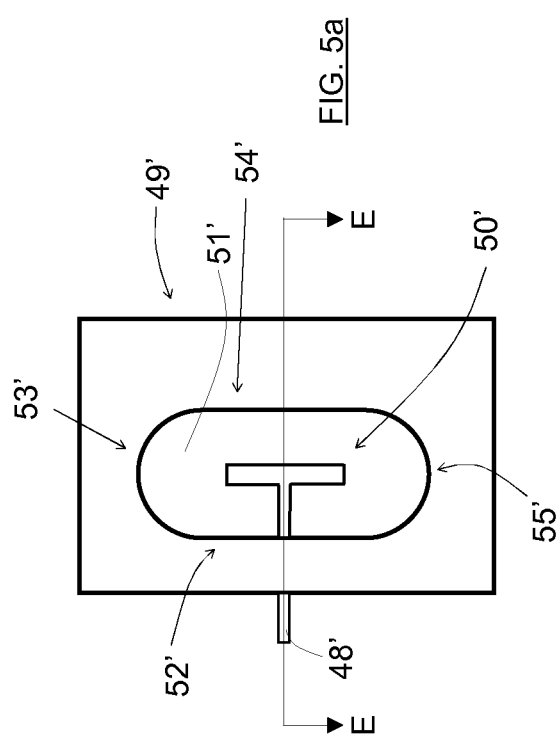
FIG. 5a shows a bottom view of an enclosure according to the second embodiment.
Figure 5B:
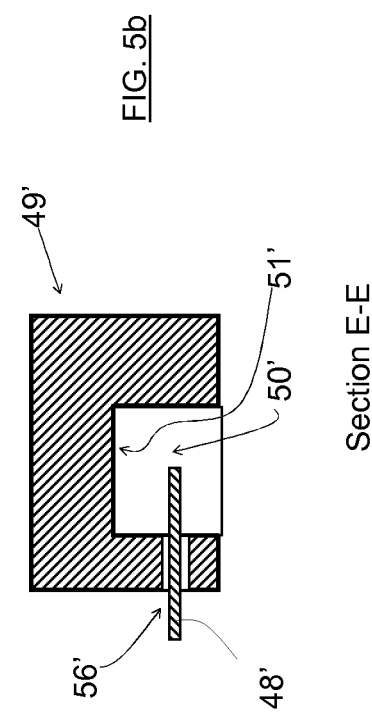
FIG. 5b shows a sectional view of an enclosure according to the second embodiment.

Also with reference to FIG. 5a and FIG. 5b, which correspond to FIG. 3a and FIG. 3b, the enclosure comprises a cavity 50' that is defined by walls 51', 52', 53', 54', 55'. The probe 48' extends from the chip 1' into the cavity 50' at a certain distance d from the bottom of the second wall 52', the probe transition 56' here for example being in the form of a glass transition or a mould with an insulating compound.

Figure 6A:
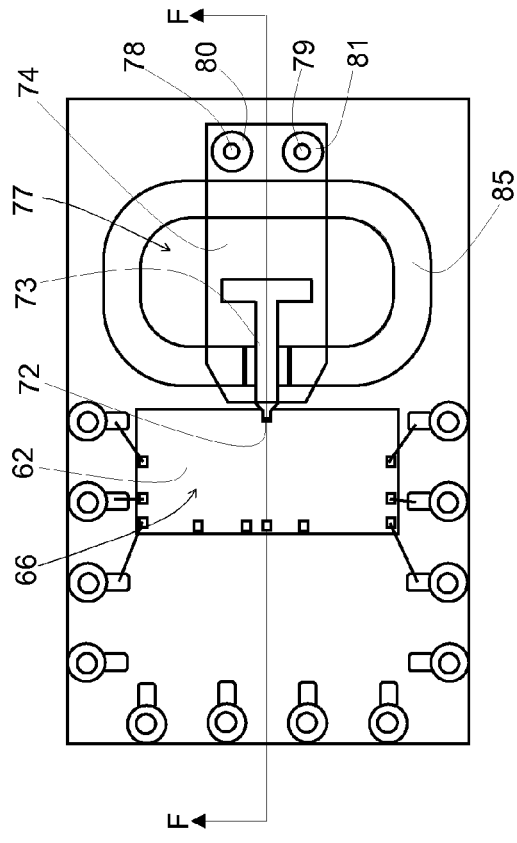
FIG. 6a shows a top view of a chip mounted to a printed circuit board according to a third embodiment.
Figure 6B:
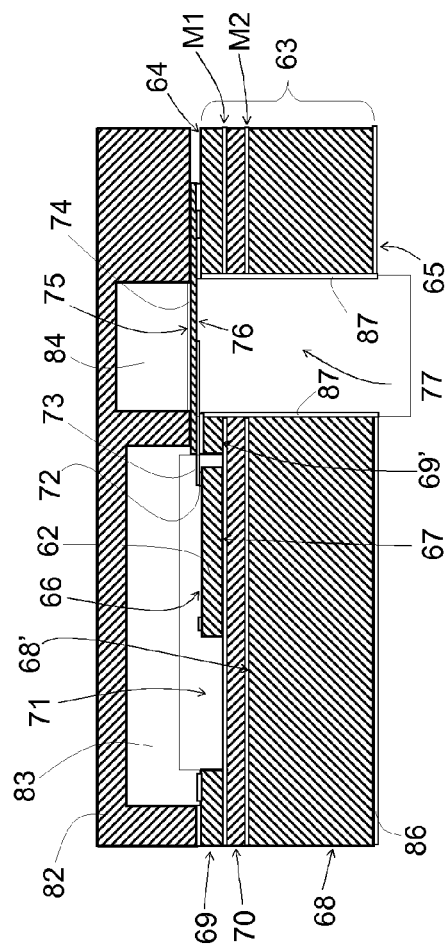
FIG. 6b shows a sectional view of a chip mounted to a printed circuit board according to the third embodiment.

According to a third embodiment, the present invention is applied without the use of a certain package as shown in FIG. 6a and FIG. 6b, showing a top view and a sectional view, respectively. Instead, a chip 62 is mounted to a PCB (printed circuit board) 63, having a first PCB main side 64 and a second PCB main side 65. The chip comprises a first main side 66 and a second main side 67. The PCB 63 may be formed in a number of different ways. In this example, the PCB 63 is in the form of a multilayer structure, comprising a bottom layer 68 and a top layer 69. The bottom layer 68 comprises a first bottom layer side 68' and a second bottom layer side, where the second bottom layer side is constituted by the second PCB main side 65. The top layer 69 comprises a first top layer side and a second top layer side 69', where the first top layer side is constituted by the first PCB main side 64.

The second top layer side 69' comprises a first metalization M1, and the first bottom layer side 68' comprises a second metalization M2.

The bottom layer 68 is made in a first material, and the top layer 69 is made in a second material, the bottom layer 68 and the top layer 69 being mounted to each other by means of an adhesive compound 70, positioned between the first metalization M1, and the second metalization M2. The adhesive compound 70 is for example in the form of a special epoxy film, known as prepreg. For example, the bottom layer 68 is comprised by re-enforced glass fibre, known as FR4, and the top layer 69 is comprised by a PTFE (polytetrafluoroethylene) laminate.

There is a cavity 71 formed in the top layer 69, such that the chip 62 is mounted to the first metalization M1. For example, the second chip main side 67 comprises a chip metalization (not shown), where the chip metalization is fastened to the first metalization M1 by means of soldering or similar.

As an alternative for the dielectric carrier material 63, it may be made having one dielectric material layer only, where the side of the dielectric material layer that faces away from the waveguide port 77 is attached to a rigid metal layer, known as hardback (not shown). In this case, a cavity is formed in the dielectric material layer such that the chip 62 is mounted to the rigid metal layer. The rigid metal layer may for example be made in copper or gold.

The chip 62 is of the same type as in the previous examples, having eleven pads, where the tenth pad 72 has been arranged for outputting a signal. The other chip pads (not indicated with reference numbers) which are further connected are not bonded to a lead-frame here, but bonded to connections on the top layer 69.

The tenth pad is connected to an electrically conducting probe 73 that is formed on a laminate 74, shown transparent for the sake of clarity, the laminate having a first laminate side 75 and a second laminate side 76, where the probe 73 is formed on the second laminate side 76. On the PCB 63, a waveguide port 77 is formed by means of a waveguide opening that runs through the PCB 63, from the first PCB main side 64 to the second PCB main side 65. The probe 73 extends partially into the waveguide port 77, and the second laminate side 76 is facing the waveguide port 77. The probe laminate 74 is for example a Liquid Crystal Polymer or made in PTFE. The probe laminate 74 is provided with two metal plated openings 78, 79 that run from the first laminate side 75 to the second laminate side 76. These metal plated openings 78, 79 correspond to solder pads 80, 81 on the PCB 63, allowing the laminate 74 to be soldered and thus fastened to the PCB 63.

In order to cover the chip 62 and to provide a matching cavity corresponding to the enclosure described for the previous embodiments, an electrically conducting lid 82 is placed over the chip 62 and its connections, and over the waveguide port 77. The lid 82 thus has two separate cavities; a first cavity 83 where the lid 82 covers the chip 62 and its connections, and a second cavity 84, where the lid 82 covers the waveguide port 77. This second cavity 84 in the lid 82 is thus formed such that the probe 73 may transfer an output signal to the waveguide port 77 in a desired manner, i.e. normally the dimensions of the second cavity 84 are adapted such that a matched transition to the waveguide port 77 is obtained. The second cavity 84 is thus defined by means of walls in the same way as in the previously described embodiments.

The lid 82 comprises a probe transition, allowing the probe 73 to pass into the second cavity 84 without being in electrical contact with the lid 82.

There is a first metalization 85 on top of the top layer 69 on the first PCB main side 64, forming a frame around the waveguide port 77, and there is a second metalization 86 at least partly covering the second PCB main side 65. Furthermore there is a third metalization covering the inside of the waveguide port, electrically connecting the first metalization 85 and the second metalization 86 such that an electrically conducting wall is obtained along the height of the PCB 63 in the waveguide opening 77 in the PCB 63. This could also bee achieved by means of vias as in the previous embodiment.

The lid 82 is preferably surface-mounted on the PCB 63.

By means of the present invention, the use of a bond wire for an output signal at relatively high frequencies, such as 60-90 GHz, may be avoided. Instead a direct connection from an output port on the chip to a probe is used, the probe being used for signal transfer to the waveguide. Of course this works reciprocally, such that the twelfth pad which in this example has been arranged for outputting a signal, instead could be arranged for receiving an input signal that is fed from the waveguide port. Then the probe is connected to an input port instead, and transfers an input signal from the waveguide port to the input port.

The present invention is not limited to the examples described above, but may vary freely within the scope of the appended claims. For example, the present invention may be used with any suitable planar structure that forms a chip. Generally, the chip forms a first planar structure and may comprise one or more electrical functionalities.

In the examples discussed above where the probe 48, 73 is fastened to the tenth pad 44, 72, this may be done in many ways, for example by means of soldering or thermal compression.

The chip 1, 62 may be made in many suitable materials such as GaAs (Gallium-Arsenide), SiGe (Silicon-Germanium) and CMOS (Complementary metal-oxide-semiconductor). The chip 1, 62 may be in the form of an MMIC (Monolithic Microwave Integrated Circuit). The lead-frame 5, where used, may for example be made in gold or beryllium copper.

The waveguide port is preferably arranged to feed, or to being fed by, a waveguide and/or an antenna, where the waveguide may be in the form of a surface-mounted waveguide.

The lid used in the third embodiment may instead be constituted by a number of lids, for example two lids, where in that case one lid comprises the first cavity and another lid comprises the second cavity. The lid or lids may be made in a non-conducting material, such as plastic, which is covered by a thin layer of metalization.

The number of metal plated openings in the laminate carrying the probe in the third embodiment may be of any suitable number. There may also not be any metal plated openings at all; alternatively, the laminate may be glued to the PCB or fastened in any other appropriate way.

The number of pads in the lead-frame and on the chip may of course vary depending on the types used; also the number of used pads and which pads that are used varies in the same way.

Where there is a metalization, the metal material may be any suitable conductor such as copper or gold.

The probe has been shown to have a T-shape, this is only an example of a probe shape. A probe used in the present invention may have any suitable shape as for example straight, chamfered, tapered and with varying widths continuously and/or in steps.

The PCB may comprise several layers if necessary, the layers comprising different types of circuitry. Such a layered structure may also be necessary for mechanical reasons. Generally, the PCB forms a second planar structure.

The frame 57 is shown comprising a single row of via holes 60. In order to further increase leakage suppression, more than one row of via holes may be used, the frame 57 then comprising at least two adjacent rows of via holes around its circumference.

The prepreg used may be any sort of suitable adhesive compound.

The metalizations M1, M2, 85, 86, 87 described are made by relatively thin metal films, having a thickness of for example 17·m or 35·m, and being made in for example copper or gold, where the copper may be plated by a desired metal.

The invention claimed is:

1. A transition from a first planar structure of a chip to a waveguide port, the first planar structure having a first main side and a second main side, wherein the first main side comprises at least one input port arranged to receive an input signal, at least one output port arranged to output an output signal, and at least one electrical functionality, wherein one port of said at least one input port and said at least one output port is electrically connected to an electrically conducting probe that extends directly, without an intervening structure, from said one port to the waveguide port to enable a signal to be transferred between said one port and the waveguide port, and wherein said one port and the electrically conducting probe are formed from the same structure, wherein the first planar structure is mounted to a first base main side of a base structure in the form of a lead frame having said first base main side and a second base main side, wherein the second main side is arranged to face the first base main side, wherein the waveguide port is arranged in the base structure, running from the first base main side to the second base main side.

2. The transition according to claim 1, wherein the waveguide port also is arranged in the first planar structure, running from the first main side to the second base main side.

3. The transition according to claim 1, wherein the first planar structure is a chip having a plurality of electrical functions, and where bond wires connect chip connections to corresponding package connections comprised in the base structure, where the base structure and the chip at least partly are comprised inside a moulding, forming a package with said package connections accessible.

4. The transition according to claim 3, wherein the package is of the type QFN, Quad Flat No Lead.

5. The transition according to claim 1, wherein an electrically conducting enclosure is positioned over the waveguide port to form a cavity having electrically conducting walls that enclose the electrically conducting probe, the dimensions of the cavity being adapted to enable the probe to transfer a signal to and/or from the waveguide port in a desired manner.

6. The transition according to claim 5, wherein the enclosure comprises a first wall, which has a main extension plane that essentially is parallel to the main sides of the first planar structure, and a second wall, a third wall, a fourth wall and a fifth wall, wherein these latter walls have main extension planes that are essentially perpendicular to the main extension plane of the first wall, extending towards the waveguide port such that the cavity is defined by said walls.

7. The transition according to claim 6, wherein the second wall comprises a probe transition, allowing the probe to pass into the cavity without being in electrical contact with the enclosure.

8. A package comprising: a chip having a plurality of electrical functions, wherein bond wires connect chip connections to corresponding package connections in a base structure, wherein the base structure and the chip are at least partly inside a moulding, forming said package with said package connections being assessable, wherein the package comprises a transition from the chip to a waveguide port, the chip having a first main side and a second main side, wherein the first main side comprises at least one input port arranged to receive an input signal, at least one output port arranged to output an output signal, and at least one electrical functionality, wherein one port of said at least one input port and at least one output port is electrically connected to an electrically conducting probe that extends directly, without an intervening structure, from said one port to the waveguide port to enable a signal to be transferred between said one port and the waveguide port, and wherein said one port and the electrically conducting probe are formed from the same structure, wherein the chip is mounted to a first base main side of the base structure in the form of a lead frame having said first base main side and a second base main side, wherein the second main side is arranged to face the first base main side, and wherein the waveguide port is arranged in the base structure, running from the first base main side to the second base main side.

9. The package according to claim 8, wherein the waveguide port also is arranged in the chip, running from the first main side to the second base main side.

10. The package according to claim 8, wherein the package is of the type QFN, Quad Flat No Lead.

11. The package according to claim 8, wherein an electrically conducting enclosure is positioned over the waveguide port to form a cavity having electrically conducting walls that enclose the electrically conducting probe, the dimensions of the cavity being adapted to enable the probe to transfer a signal to and/or from the waveguide port in a desired manner.

12. The package according to claim 11, wherein the enclosure comprises a first wall, which has a main extension plane that essentially is parallel to the main sides of the chip, and a second wall, a third wall, a fourth wall and a fifth wall, where these latter walls have main extension planes that are essentially perpendicular to the main extension plane of the first wall, extending towards the waveguide port such that the cavity is defined by said walls.

13. The package according to claim 12, wherein the second wall comprises a probe transition, allowing the probe to pass into the cavity without being in electrical contact with the enclosure.

* * * * *

UNITED STATES PATENT AND TRADEMARK OFFICE
CERTIFICATE OF CORRECTION

| | | |
|---|---|---|
| PATENT NO. | : 8,901,719 B2 | Page 1 of 1 |
| APPLICATION NO. | : 13/319171 | |
| DATED | : December 2, 2014 | |
| INVENTOR(S) | : Ligander | |

It is certified that error appears in the above-identified patent and that said Letters Patent is hereby corrected as shown below:

Specification

In Column 5, Line 19, delete "waveguide port 48." and insert -- waveguide port 47. --, therefor.

Signed and Sealed this
Fifth Day of January, 2016

Michelle K. Lee
*Director of the United States Patent and Trademark Office*